(12) United States Patent
Tanaka et al.

(10) Patent No.: US 8,395,172 B2
(45) Date of Patent: Mar. 12, 2013

(54) LIGHT EMITTING DEVICE

(75) Inventors: Akira Tanaka, Kanagawa-ken (JP);
Katsufumi Kondo, Fukuoka-ken (JP);
Tokuhiko Matsunaga, Fukuoka-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 274 days.

(21) Appl. No.: 12/961,476

(22) Filed: Dec. 6, 2010

(65) Prior Publication Data

US 2011/0291133 A1 Dec. 1, 2011

(30) Foreign Application Priority Data

May 26, 2010 (JP) .................................. 2010-120387

(51) Int. Cl.
*H01L 33/00* (2010.01)
(52) U.S. Cl. ..................... 257/98; 257/99; 257/E33.066; 257/E33.073
(58) Field of Classification Search ..................... 257/98, 257/99, E33.066, E33.073
See application file for complete search history.

(56) References Cited

U.S. PATENT DOCUMENTS

| | | | |
|---|---|---|---|
| 2010/0283035 A1* | 11/2010 | Tanaka ............................ | 257/13 |
| 2010/0308301 A1* | 12/2010 | Unno et al. ..................... | 257/13 |
| 2012/0146083 A1* | 6/2012 | Liu et al. ......................... | 257/98 |
| 2012/0168805 A1* | 7/2012 | Lee et al. ........................ | 257/98 |
| 2012/0256226 A1* | 10/2012 | Hwang et al. .................. | 257/98 |

FOREIGN PATENT DOCUMENTS

| | | |
|---|---|---|
| JP | 2000-200924 | 7/2000 |
| JP | 2001-352097 | 12/2001 |
| JP | 2005-317663 | 11/2005 |

OTHER PUBLICATIONS

Japanese Office Action dated Jul. 20, 2012, filed in Japanese counterpart Application No. 2010-120387, 4 pages (with English translation).

* cited by examiner

*Primary Examiner* — David S Blum
(74) *Attorney, Agent, or Firm* — Patterson & Sheridan, LLP

(57) ABSTRACT

According to one embodiment, a light emitting device includes a light emitting layer, a first conductivity type layer, a first electrode, a second conductivity type layer, a current blocking layer and a second electrode. The first conductivity type layer is provided on the light emitting layer. The first electrode is provided on the first conductivity type layer. The second conductivity type layer is provided under the light emitting layer. The current blocking layer is provided in contact with a partial region of a surface of the second conductivity type layer, and has an outer edge protruding from an outer edge of the first electrode. The second electrode is in contact with a surface of the current blocking layer on opposite side from the second conductivity type layer and a region of the surface of the second conductivity type layer not in contact with the current blocking layer.

20 Claims, 10 Drawing Sheets

LIGHT EMITTING DEVICE

CROSS-REFERENCE TO RELATED APPLICATIONS

This application is based upon and claims the benefit of priority from the prior Japanese Patent Application No. 2010-120387, filed on May 26, 2010; the entire contents of which are incorporated herein by reference.

FIELD

Embodiments described herein relate generally to a light emitting device.

BACKGROUND

Light emitting devices used for illumination devices, display devices, and traffic lights are required to achieve higher output.

The optical output can be increased if emission light directed downward from the light emitting layer is reflected upward by the reflection layer provided between the light emitting layer and the substrate.

Furthermore, the light emitting region can be shifted to the outside of the upper electrode by providing a current blocking layer below the upper electrode to reduce current injection. Thus, the amount of blocking the reflection light can be reduced, and the optical output can be further increased. In addition, this reduces wasteful emission light and improves the light extraction efficiency. However, the current blocking layer being too large causes a problem of increased forward voltage and increased chip size.

DETAILED DESCRIPTION

In general, according to one embodiment, a light emitting device includes a light emitting layer, a first conductivity type layer, a first electrode, a second conductivity type layer, a current blocking layer and a second electrode. The first conductivity type layer is provided on the light emitting layer. The first electrode is provided on the first conductivity type layer. The second conductivity type layer is provided under the light emitting layer and has thickness t1 (μm). The current blocking layer is provided in contact with a partial region of a surface of the second conductivity type layer on opposite side from the light emitting layer, and has an outer edge protruding by length x1 (μm) from an outer edge of the first electrode. The second electrode is in contact with a surface of the current blocking layer on opposite side from the second conductivity type layer and a region of the surface of the second conductivity type layer not in contact with the current blocking layer, and is capable of reflecting emission light from the light emitting layer. A following formula is satisfied, $$\frac{(x1 - t2 \times \tan 70°)}{\left(\tan 70° + \frac{x1}{t2}\right)} - t1 \geq 0$$

where t2 (μm) is total thickness of the first conductivity type layer, the light emitting layer, and the second conductivity type layer.

Embodiments of the invention will now be described with reference to the drawings.

Figure 1A:
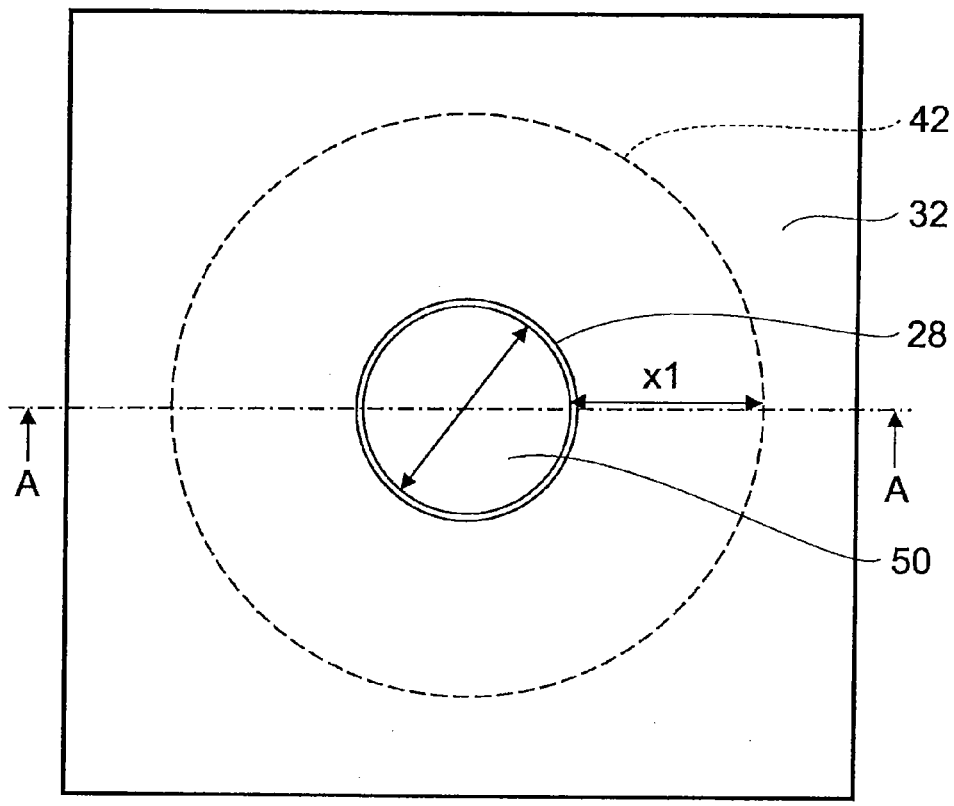
FIG. 1A is a schematic plan view of a light emitting device according to a first embodiment.
Figure 1B:
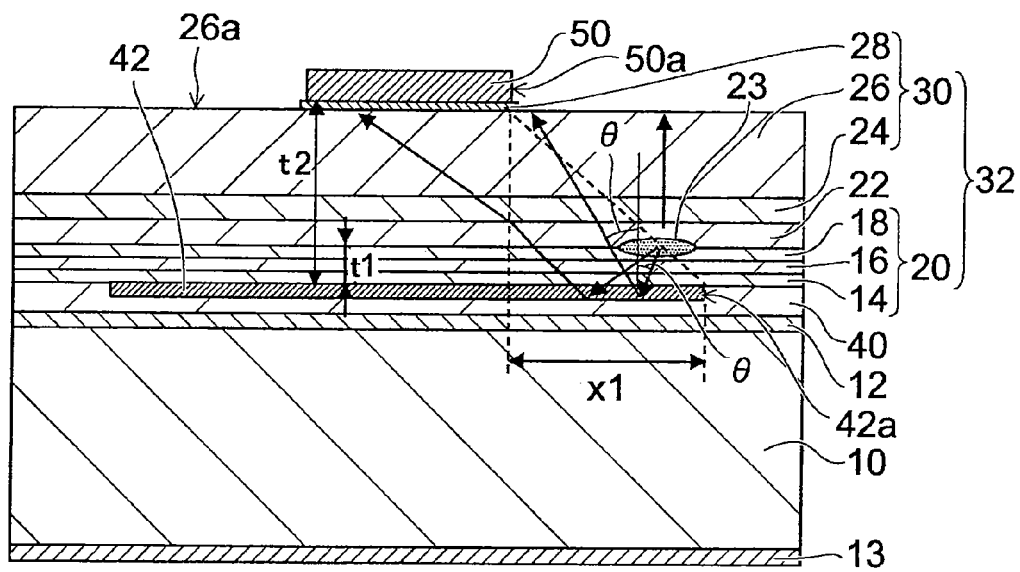
FIG. 1B is its schematic sectional view.

FIG. 1A is a schematic plan view of a light emitting device according to a first embodiment of the invention, and FIG. 1B is a schematic sectional view taken along line A-A. The light emitting device includes a laminated body 32, a first electrode 50, a current blocking layer 42, a second electrode 40, a substrate upper electrode 12, a substrate 10, and a substrate lower electrode 13.

The laminated body 32 includes a light emitting layer 22, a first conductivity type layer 30 provided above the light emitting layer 22, and a second conductivity type layer 20 provided below the light emitting layer 22 and having thickness t1 (μm). The first conductivity type layer 30 includes, from the light emitting layer 22 side, a cladding layer 24, a current diffusion layer 26, and a contact layer 28. The second conductivity type layer 20 includes, from the light emitting layer 22 side, a cladding layer 18, a current diffusion layer 16, and a contact layer 14.

The current blocking layer 42 is provided in contact with a partial region of the surface of the second conductivity type layer 20 on the opposite side from the light emitting layer 22. The outer edge 42a of the current blocking layer 42 protrudes radially by protrusion length x1 (μm) from the outer edge 50a of the first electrode 50. The second electrode 40 is provided in contact with the current blocking layer 42 and the region of the second conductivity type layer 20 not in contact with the current blocking layer 42, and can reflect emission light from the light emitting layer 22. The second electrode 40 includes Au, Al, or Ag. The current blocking layer 42 may be a reflective film made of at least two dielectric multilayer films having different refractive indices.

The current blocking layer 42 thus provided allows carriers injected from the first electrode 50 to spread radially in the current diffusion layer 26 and flow into the light emitting layer 22. On the other hand, carriers injected from the second electrode 40 are injected from the region of the current blocking layer 42 on the outer edge 42a side and flow into the light emitting layer 22. That is, the neighborhood of the dashed line connecting between the outer edge 50a of the first electrode 50 and the outer edge 42a of the current blocking layer 42 constitutes a current path. This neighborhood of the dashed line in the light emitting layer 22 constitutes a light emitting region 23.

Emission light directed upward from the light emitting region 23 is emitted upward from the upper surface 26a of the current diffusion layer 26. On the other hand, most of the emission light directed downward from the light emitting region 23 are reflected by the second electrode 40. Among them, emission light having a small incident angle θ to the second electrode 40 can be emitted upward.

The laminated body 32 can be made of a material such as InAlGaP, AlGaAs, and InGaAlN. InAlGaP refers to $In_x(Al_yGa_{1-y})_{1-x}P$ ($0 \leq x \leq 1$, $0 \leq y \leq 1$) and may include acceptor or donor elements. AlGaAs refers to $Al_xGa_{1-x}As$ ($0 \leq x \leq 1$) and may include acceptor or donor elements. InGaAlN refers to $In_xGa_yAl_{1-x-y}N$ ($0 \leq x \leq 1$, $0 \leq y \leq 1$, $x+y \leq 1$) and may include acceptor or donor elements.

In this embodiment, the current blocking layer 42 is made larger than the first electrode 50 to reduce the amount of light blocking by the first electrode 50 for the reflection light from the second electrode 40 provided below the light emitting layer 22. This facilitates increasing the upward light extraction efficiency.

Figure 2:
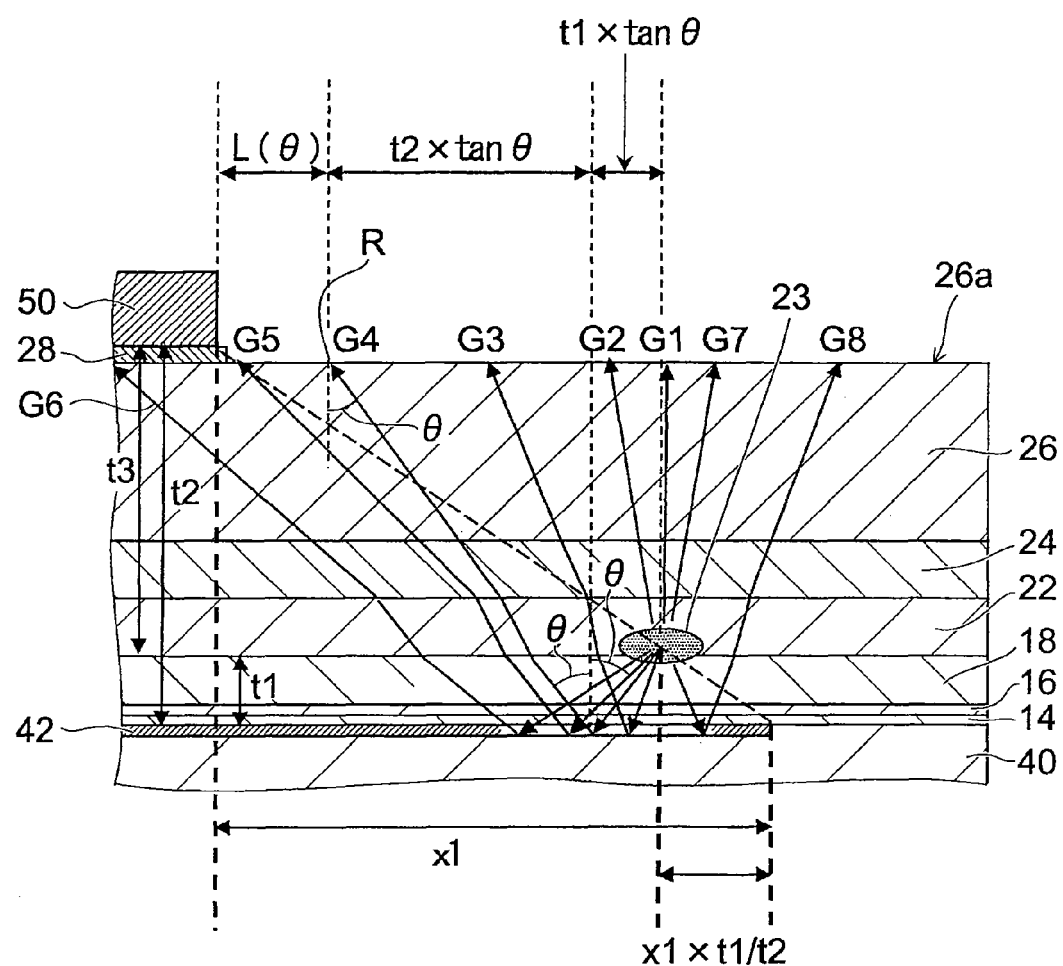
FIG. 2 is a partially enlarged schematic sectional view of the first embodiment.

FIG. 2 is a partially enlarged schematic sectional view of the first embodiment of FIGS. 1A and 1B.

In FIG. 2, the laminated body 32 includes InAlGaP, and the first conductivity type is n-type, and the second conductivity type is p-type. The first conductivity type (n-type) layer 30 illustratively includes a cladding layer 24 made of InAlP (carrier concentration $4 \times 10^{17}$ cm$^{-3}$, thickness 0.6 µm), a current diffusion layer 26 made of $In_{0.5}(Ga_{0.3}Al_{0.7})_{0.5}P$ (carrier concentration $4 \times 10^{17}$ cm$^{-3}$, thickness 3.3 µm), and a contact layer 28 made of GaAs (carrier concentration $1 \times 10^{18}$ cm$^{-3}$, thickness 0.1 µm).

The light emitting layer 22 has an MQW (multiple quantum well) structure. For instance, the well layer is made of $In_{0.5}(Ga_{0.94}Al_{0.06})_{0.5}P$, where the thickness is 10 nm and the number of layers is 10. The barrier layer is made of $In_{0.5}(Ga_{0.4}Al_{0.6})_{0.5}P$, where the thickness is 20 nm and the number of layers is 21.

The second conductivity type (p-type) layer 20 illustratively includes a cladding layer 18 made of InAlP (carrier concentration $3 \times 10^{17}$ cm$^{-3}$), a current diffusion layer 16 made of $In_{0.5}(Ga_{0.3}Al_{0.7})_{0.5}P$ (carrier concentration $1 \times 10^{18}$ cm$^{-3}$), and a contact layer 14 made of $Al_{0.5}Ga_{0.5}As$ (carrier concentration $1 \times 10^{19}$ cm$^{-3}$). The thickness t1 of the second conductivity type layer 20 is set equal to or less than the thickness of the first conductivity type layer 30. In the case where the second conductivity type layer 20 is of p-type, if the thickness of the cladding layer 18 is too small, electron overflow increases, and ineffective current increases. Hence, it is preferable to set t1 to 0.7 µm or more.

Here, the first conductivity type layer 30 may be of p-type, and the second conductivity type layer 20 may be of n-type. However, in such materials as InAlGaP, AlGaAs, and InGaAlN, the hole mobility is lower than the electron mobility. Hence, this embodiment is more preferable because the resistance component can be reduced by shortening the moving distance of holes.

In FIG. 2, light emitted upward from the light emitting region 23 travels like upward lights G1, G2, and G7. On the other hand, light emitted downward travels like upward lights G3, G4, G5, G6, and G8. Light directed inward with respect to the light emitting region 23 is incident on the second electrode 40 below the current blocking layer 42 at incident angle θ, and reflected at reflection angle θ. Here, the current blocking layer 42 only needs to block current flow into the second electrode 40, and hence can be thinned. Hence, the incident angle to the current blocking layer 42 is assumed to be generally equal to the incident angle θ to the second electrode 40. Furthermore, the reflection angle θ at the second electrode 40 is assumed to be generally equal to the exit angle from the current blocking layer 42.

The light G3, G4 having a small incident angle θ can be emitted upward without being blocked by the first electrode 50. On the other hand, the light beam G6 having a large incident angle θ is reflected by the first electrode 50 and travels downward again. Thus, the light G6 having a large incident angle θ often fails to be effectively extracted upward due to repetitive reflection. The light G5 corresponds to the case where the reflection light impinges on the outer edge 50a of the first electrode 50. The incident angle for this case is defined as maximum incident angle θmax. That is, for large x1, the maximum incident angle θmax is large. Light in the range of $0 \leq \partial \leq \theta max$ is not blocked by the first electrode 50.

Figure 3:
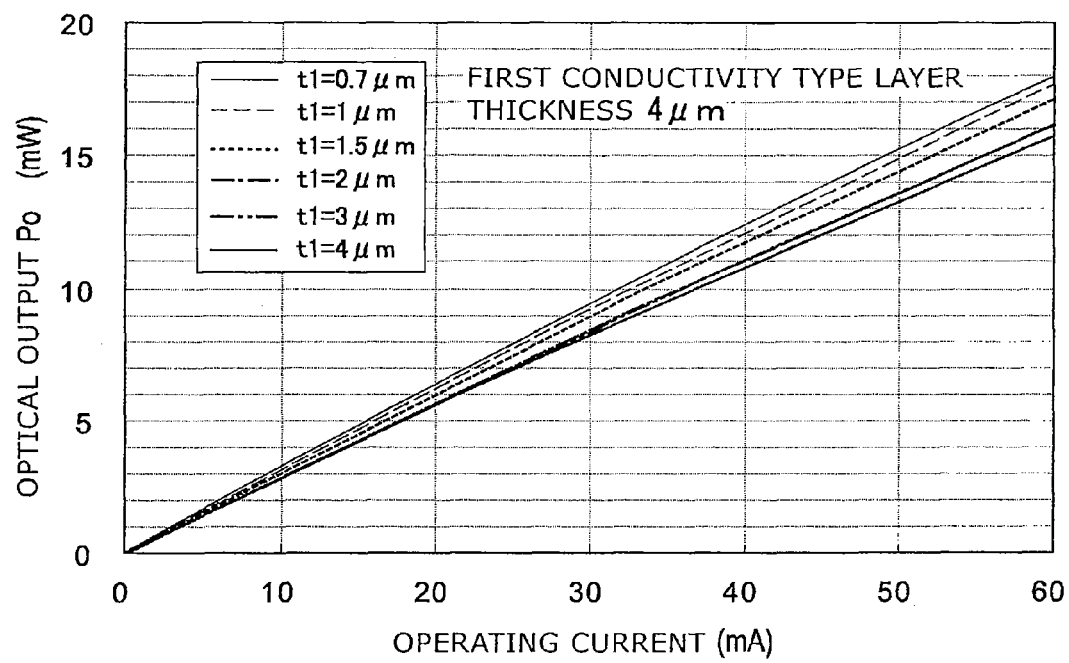
FIG. 3 is a graph showing a simulation result of the dependence of optical output on operating current in the first embodiment.

FIG. 3 is a graph showing a simulation result of the dependence of optical output on operating current for the light emitting device according to the first embodiment (FIG. 2).

The vertical axis represents optical output Po (mW), and the horizontal axis represents operating current (mA). In this simulation, the first electrode 50 has a circular shape with a diameter of 120 µm, and the current blocking layer 42 has a circular shape with a diameter of 200 µm. The thickness of the first conductivity type (n-type) layer 30 is 4 µm. The thickness t1 of the second conductivity type (p-type) layer 20 is in the range of 0.7 µm or more and equal to or less than the thickness of the first conductivity type layer 30 (4 µm). Except the light G6 reflected by the current blocking layer 42 and blocked by the first electrode 50, the total output of light reachable to the surface 26a of the current diffusion layer 26 is represented as optical output Po.

The light reaching the surface 26a is partly reflected by the refractive index difference with respect to the medium (refractive index n) on the current diffusion layer 26. However, by providing a dielectric film having a refractive index with a small difference from the refractive index of the medium constituting the surface 26a, or by providing an unevenness at the interface, total reflection at the interface can be reduced so that the extracted output becomes close to Po.

In the case where the thickness t1 of the second conductivity type layer 20 is 2-3 µm, at an operating current of 60 mA, the optical output Po is generally 16 mW or less. On the other hand, in the case where the thickness t1 is 1.5 µm, at an operating current of 60 mA, the optical output Po is generally 17 mW. In the case where the thickness t1 is 0.7 µm, at an operating current of 60 mA, the optical output Po increases to generally 18 mW. In particular, in the case where t1 is 1.5 µm or less, the rate of increase of the optical output Po can be made higher. If the carrier concentration in the second conductivity type (p-type) cladding layer 18 can be made higher than $3 \times 10^{17}$ cm$^{-3}$, the thickness t1 of the second conductivity type layer 20 can be thinned, and the optical output Po is readily made higher.

Figure 4A:
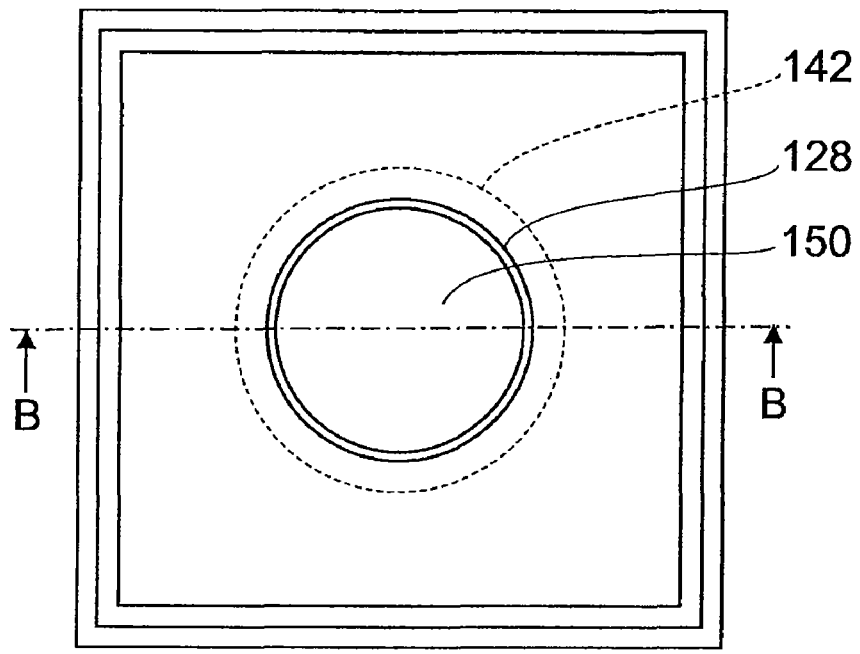
FIG. 4A is a schematic plan view of a light emitting device according to a comparative example.
Figure 4B:
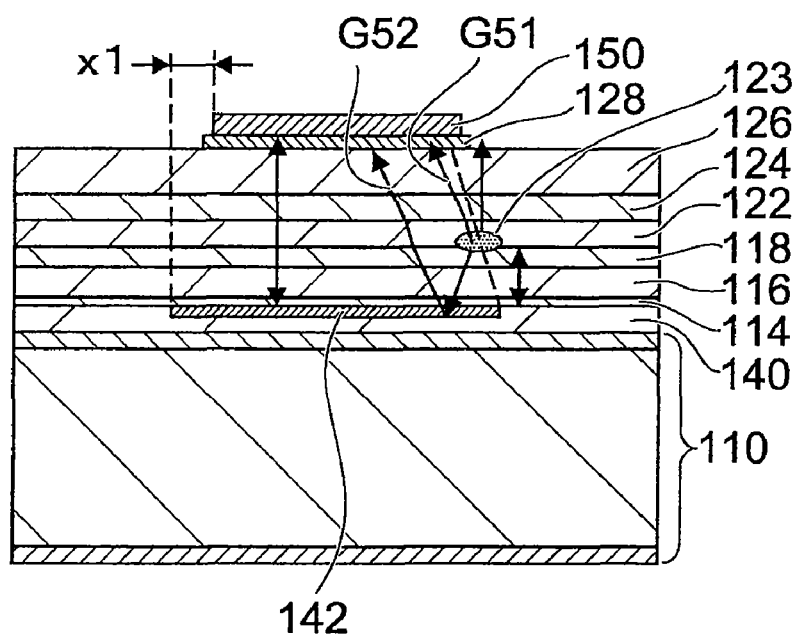
FIG. 4B is its schematic sectional view.

FIG. 4A is a schematic plan view of a light emitting device according to a comparative example, and FIG. 4B is a schematic sectional view taken along line B-B.

In the comparative example, the protrusion length x1 of the current blocking layer is 10 µm. For small x1, emission light is emitted to a neighborhood immediately above the light emitting region 123. However, like lights G51 and G52, reflection light is blocked by the first electrode 150, and hence is difficult to extract outside. That is, while ineffective current can be reduced, the optical output is difficult to increase.

Figure 5A:
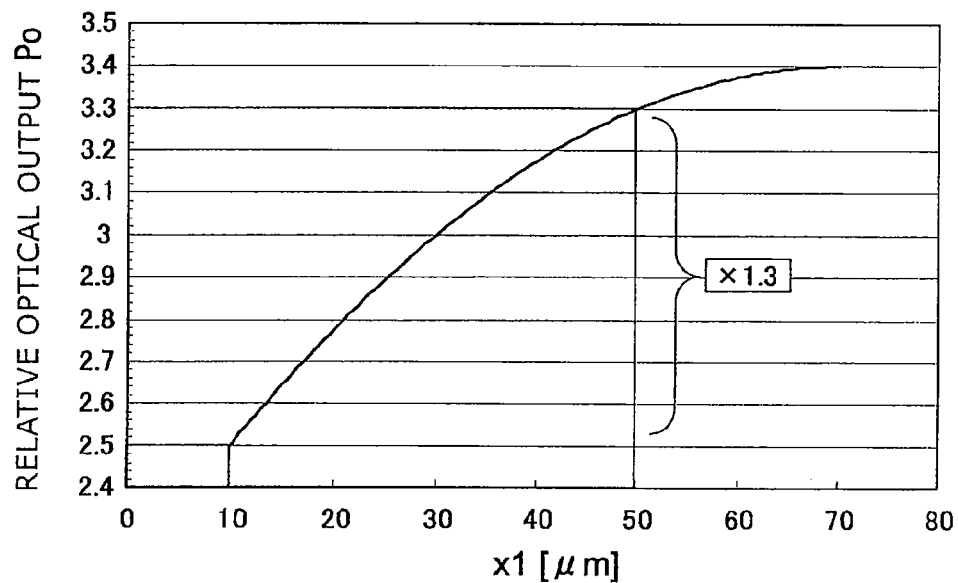
FIG. 5A is a graph showing the dependence of relative optical output on the protrusion length x1 of the current blocking layer.
Figure 5B:
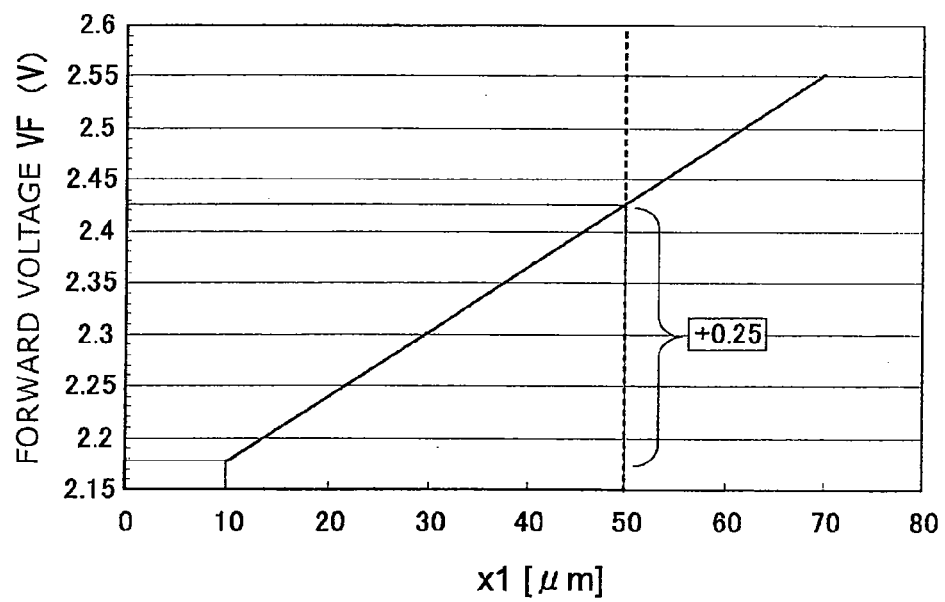
FIG. 5B is a graph showing the dependence of forward voltage on the protrusion length x1.

FIG. 5A is a graph showing the dependence of relative optical output on the protrusion length x1 of the current blocking layer. FIG. 5B is a graph showing the dependence of forward voltage on the protrusion length x1.

When x1 is 50 μm, the optical output Po increases to 132% relative to the comparative example of FIGS. 4A and 4B. Thus, the relative optical output Po increases with x1. However, the rate of increase gradually decreases, and the relative optical output Po tends to be saturated. On the other hand, the forward voltage of the comparative example is 2.18 V. However, when x1 is 50 μm, the forward voltage VF is as high as 2.43 V. Furthermore, the forward voltage VF linearly increases. That is, in the region where x1 is larger than 50 μm, the light emission efficiency decreases with the increase of Furthermore, the chip size also increases accordingly. Hence, the upper limit of x1 is set to 50 μm. It is understood from the foregoing that to increase the optical output while maintaining the light emission efficiency, a prescribed relationship needs to be satisfied among x1, t1, and t2.

Suppose that emission light incident at incident angle θ is reflected by the second electrode 40 and reaches the surface 26a of the current diffusion layer 26 at position R. The distance L(θ) between the position R and the outer edge 50a of the first electrode 50 is given by equation (1).

$$L(\theta) = x1 - x1 \times \left(\frac{t1}{t2}\right) - (t1 + t2) \times \tan\theta \quad (1)$$

Furthermore, a variable Y is defined by equation (2).

$$Y = \frac{(x1 - t2 \times \tan\theta max)}{\left(\tan\theta max + \frac{x1}{t2}\right)} - t1 \quad (2)$$

Lights G2, G3, G4, and G5 with incident angle θ (0≦θ≦θmax) in the range satisfying L(θ)≧0 reach the surface 26a of the current diffusion layer 26, and are not blocked by the first electrode 50. This means that light with incident angle θ in the range up to θmax is expected to contribute to the optical output Po.

Figure 6A:
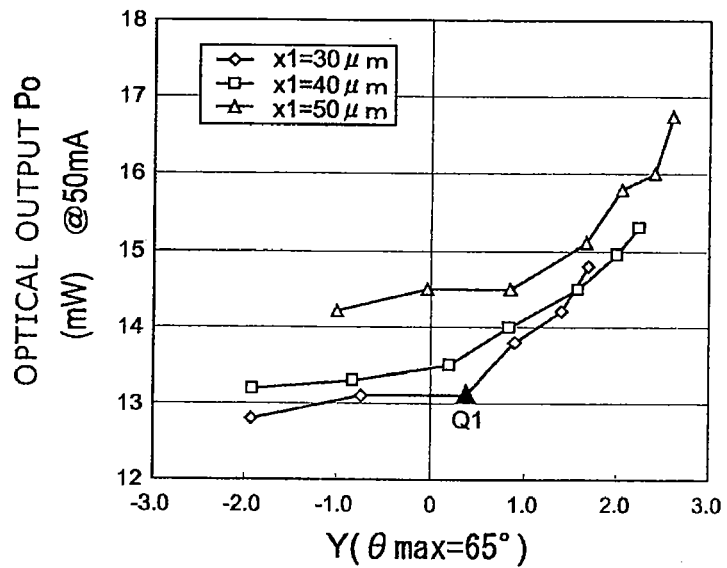
FIGS. 6A to 6C are graphs of simulation results showing the dependence of optical output on the variable Y.
Figure 6B:
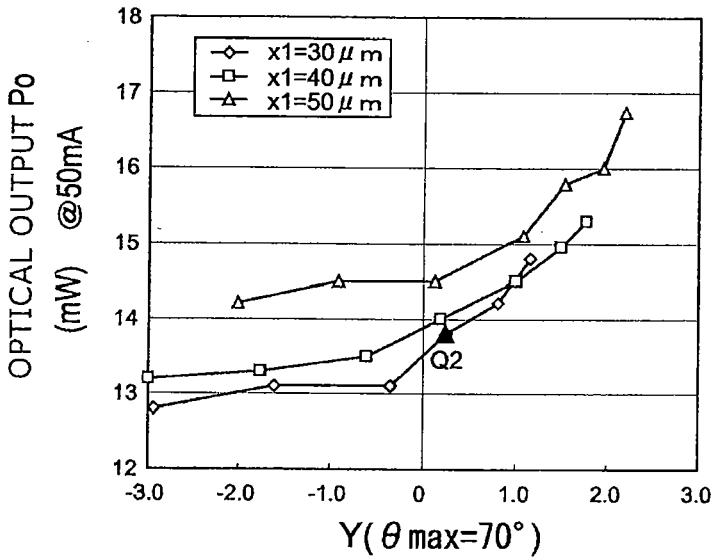
Figure 6C:
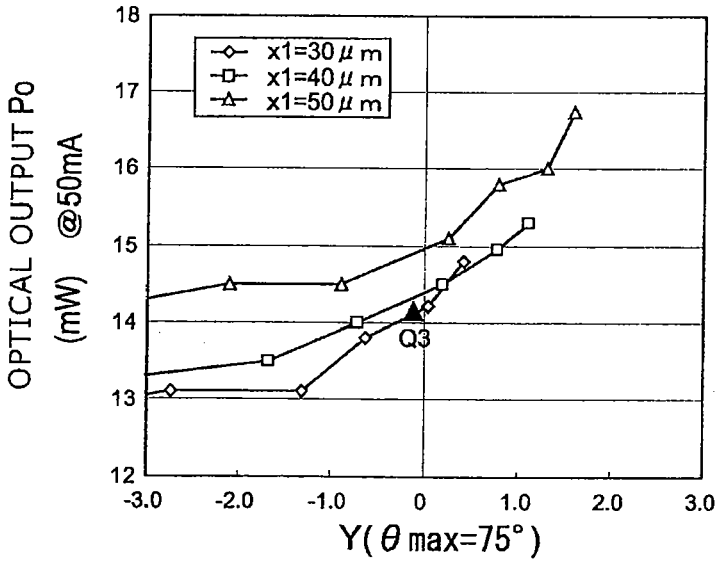

FIGS. 6A to 6C are graphs of simulation results showing the dependence of optical output on the variable Y.

The vertical axis represents optical output Po (mW) at an operating current of 50 mA. The horizontal axis of FIG. 6A represents variable Y (μm) with θmax being 65°. The horizontal axis of FIG. 6B represents variable Y (μm) with θmax being 70°. The horizontal axis of FIG. 6C represents variable Y (μm) with θmax being 75°. The radius of the current blocking layer 42 is the sum of the radius of the first electrode 50 and x1, where x1 is set to 30, 40, and 50 μm.

In FIG. 6A, in the range of Y (θmax=65°) being generally 0.8 μm or more, the optical output Po increases with the increase of Y. In FIG. 6B, in the range of Y (θmax=70°) being zero or more, the optical output Po increases with the increase of Y. In FIG. 6C, in the range of Y (θmax=75°) being −1 μm or more, the optical output Po increases with the increase of Y.

In FIGS. 6A to 6C, the variable Y is compared with the optical output Po for the structure where x1=30 μm, t1=1.5 μm, and t2=3 μm. In FIG. 6A where θmax is 65°, the variable Y is Y=0.45 μm, and Po at point Q1 on the line corresponding to x1=30 μm is 13.1 mW. In FIG. 6B where θmax is 70°, the variable Y is Y=0.2 μm, and Po at point Q2 on the line corresponding to x1=30 μm is 13.7 mW. Furthermore, in FIG. 6C where θmax is 75°, the variable Y is Y=−0.12 μm, and the optical output Po at point Q3 on the line corresponding to x1=30 μm is 14.1 mW. In response to the variation of θmax as 65°, 70°, and 75°, the point where the optical output Po starts to increase is gradually shifted to the left side along the Y axis as Q1, Q2, and Q3. Furthermore, if t1 is decreased, the light emitting region 23 can be shifted toward the outer edge 42a of the current blocking layer 42, and the amount of light blocking by the first electrode 50 can be reduced. Hence, the optical output Po can be further increased.

That is, in any case of FIGS. 6A to 6C, the range of Y where the optical output Po increases can be expressed. If FIG. 6B corresponding to θmax=70° is used, the range where the optical output Po increases can be simply expressed as According to the inventors' simulation, it turns out that in the case of θmax=70°, generally 90% of the light emitted downward from the light emitting region 23 contributes to the optical output Po.

From equations (1) and (2), the condition Y≧0 generally corresponds to L(θmax)≧0. Furthermore, the condition L(θmax)≧0 does not depend on the material of the laminated body. That is, the condition holds for the laminated body including InAlGaP, AlGaAs, and InGaAlN. Furthermore, the condition Y≧0 can also be expressed as formula (3).

$$\frac{(x1 - t2 \times \tan 70°)}{\left(\tan 70° + \frac{x1}{t2}\right)} - t1 \geq 0 \quad (3)$$

From formula (3), the relation required among x1, t1, and t2 is expressed as formula (4).

$$x1 \geq \frac{t2(t1 + t2)}{t2 - t1} \times \tan 70° \quad (4)$$

Here, t2−t1=t3 (sum of the thickness of the first conductivity type layer 30 and the thickness of the light emitting layer 22). Hence, assuming that t3 is constant, the right-hand side of the inequality expresses a quadratic function of t1. This indicates that by decreasing t1, the lower limit of x1 can be decreased, and the chip size can be reduced.

Figure 7:
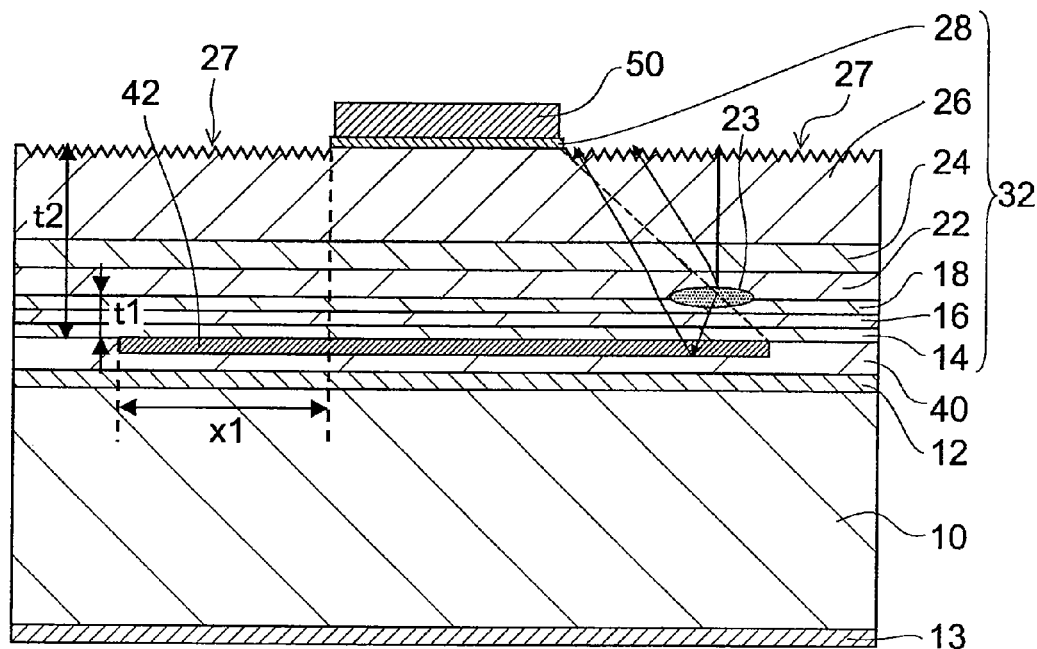
FIG. 7 is a schematic sectional view of a light emitting device according to a second embodiment.

FIG. 7 is a schematic sectional view of a light emitting device according to a second embodiment.

An unevenness 27 is formed at the surface 26a of the current diffusion layer 26. Then, the range of the intersection angle between the light beam and the surface can be expanded, and total reflection at the surface 26a can be reduced. Hence, the output which can be extracted outside the chip can be made close to the simulated optical output Po. Here, if the pitch of the unevenness 27 is made smaller than the half-wavelength, the diffraction effect is enhanced, and the unevenness 27 can be regarded as a medium having a two-dimensionally uniform equivalent dielectric constant. Thus, the unevenness 27 acts as a graded index region, and the reflectance at the surface can be reduced. Alternatively, a dielectric having a refractive index between the refractive index of the external medium and the refractive index of the current diffusion layer 26 can be provided outside the surface. Also in this case, the output extracted outside can be made close to the optical output Po. Thus, the light reflected by the current blocking layer 42 can be extracted more effectively.

Figure 8:
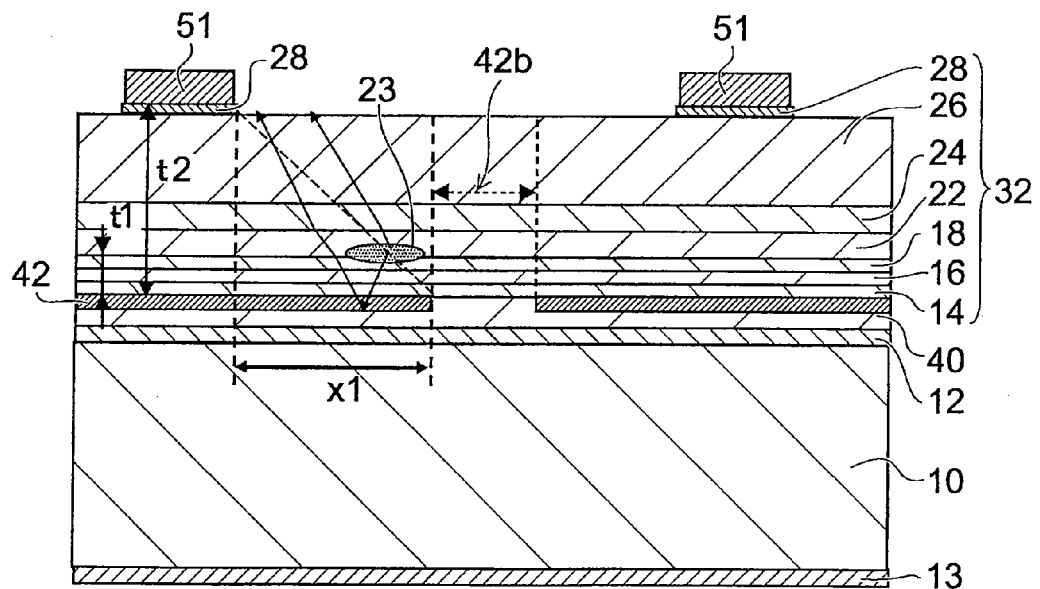
FIG. 8 is a schematic sectional view of a light emitting device according to a third embodiment.

FIG. 8 is a schematic sectional view of a light emitting device according to a third embodiment.

The first electrode 50 includes a pad portion (first electrode 50 in FIG. 1), and further includes a thin interconnection portion 51 connected to the pad portion. The thin interconnection portion 51 can be shaped like a stripe or an annulus in plan view. Between the thin interconnection portions 51 and between the thin interconnection portion 51 and the pad portion, a spaced region 42b is provided in the current blocking layer 42 to provide a current path. The width of the thin interconnection portion 51 can illustratively be in the range of 2-10 μm.

Figure 9A:
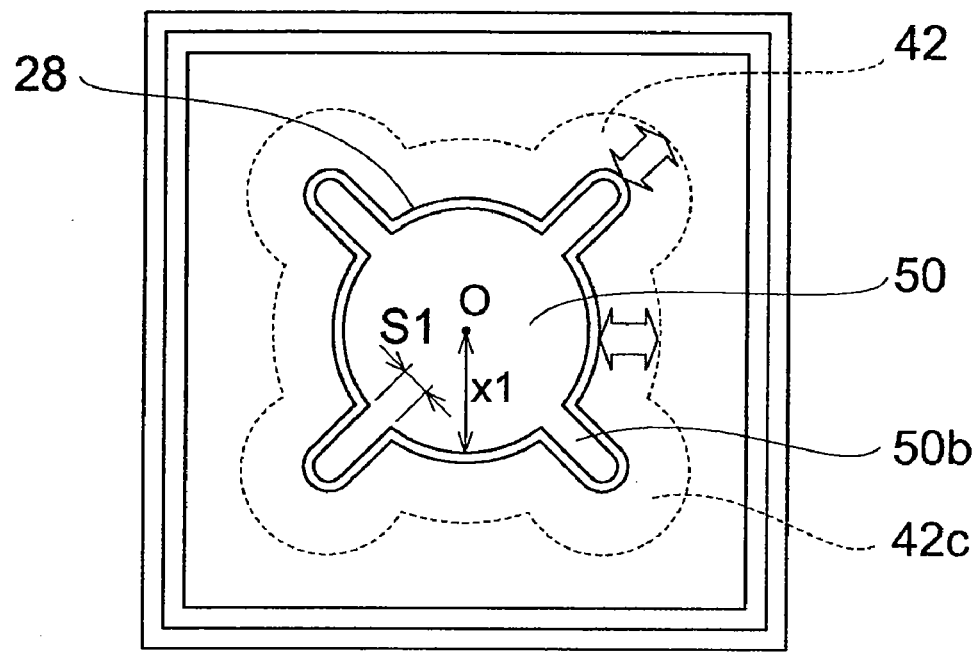
FIGS. 9A and 9B are schematic plan views of light emitting devices according to a fourth embodiment.
Figure 9B:
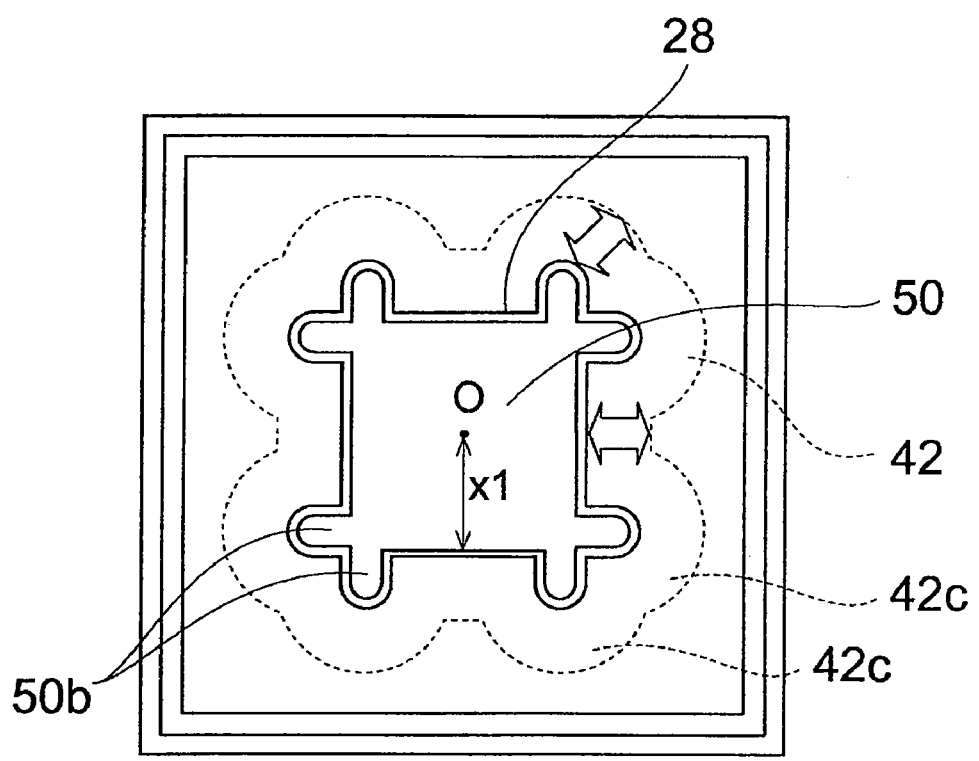

FIGS. 9A and 9B are schematic plan views of light emitting devices according to a fourth embodiment.

In FIG. 9A, the first electrode 50 includes four projections 50b toward the chip corners. The current blocking layer 42 includes four projections 42c below the first electrode 50. Thus, the outer perimeter EE of the boundary between the outer edge of the current blocking layer 42 and the second electrode 40 can be increased.

Figure 10A:
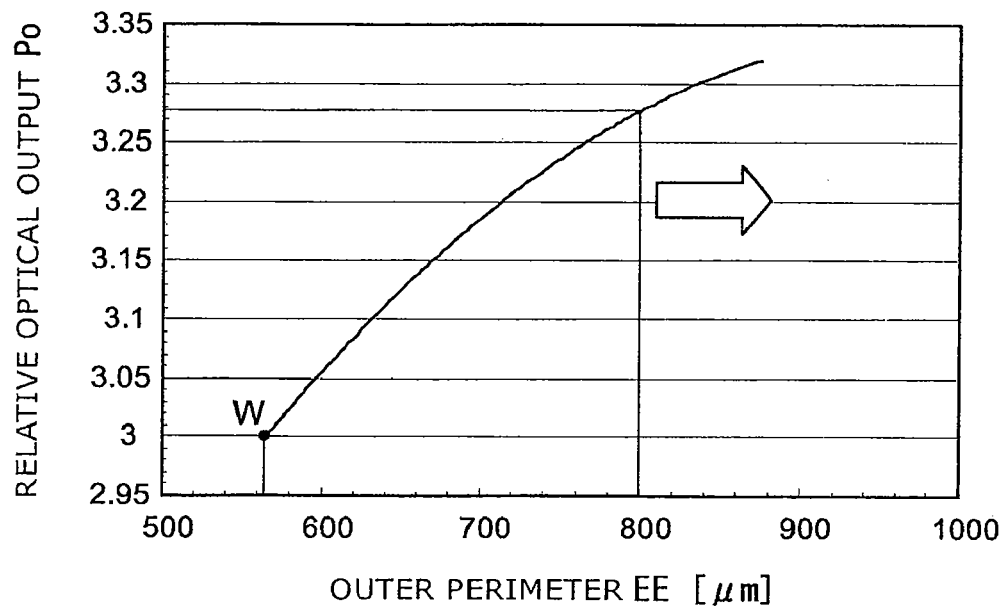
FIG. 10A is a graph showing the dependence of relative optical output on outer perimeter.
Figure 10B:
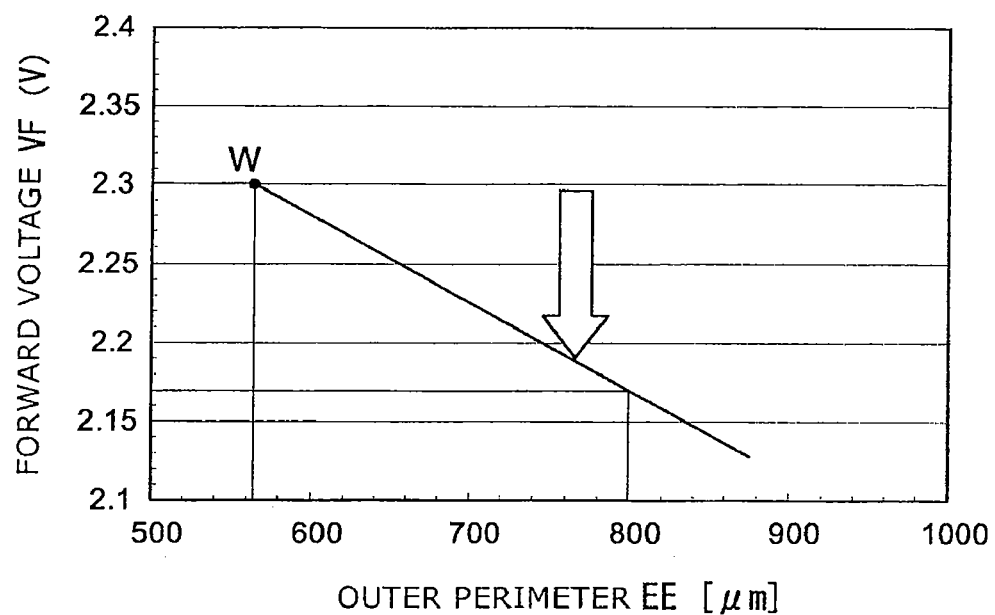
FIG. 10B is a graph showing the dependence of forward voltage on outer perimeter.

FIG. 10A is a graph showing the dependence of optical output on outer perimeter. FIG. 10B is a graph showing the dependence of forward voltage on outer perimeter.

In FIG. 10A, the vertical axis represents relative optical output Po (relative brightness), and the horizontal axis represents the boundary outer perimeter EE (μm). In FIG. 10B, the vertical axis represents forward voltage VF (V), and the horizontal axis represents the boundary outer perimeter EE (μm). In the region except the projections, x1 is set to 30 μm. The operating current is set to 50 mA. Here, as in FIG. 9B, in the case where the shape of the first electrode 50 and the current blocking layer 42 is not circular, x1 is represented by the shortest distance from the center O of the first electrode 50. The characteristic of the light emitting device with x1 being 10 μm and the outer perimeter being 550 μm is indicated by point W.

In the light emitting device patterned as FIG. 9A, when the outer perimeter EE is 830 μm, the optical output Po is 110% of the characteristic at point W. In the light emitting device patterned as FIG. 9B, when the outer perimeter EE is 870 μm, the optical output Po is 111% relative to point W. On the other hand, in the light emitting device patterned as FIG. 9A, when the outer perimeter is 830 μm, the forward voltage VF can be reduced to 2.16 V, as compared with 2.3 V at point W. In the light emitting device patterned as FIG. 9B, when the outer perimeter EE is 870 μm, the forward voltage VF can be reduced to 2.13 V. A forward voltage VF of 2.17 V or less can be achieved by setting the outer perimeter EE to 800 μm or more.

Figure 11A:
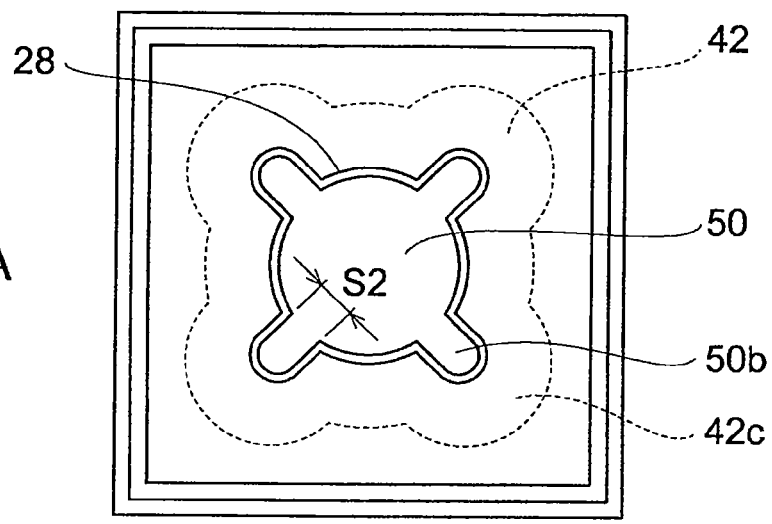
FIGS. 11A to 11C are schematic plan views of light emitting devices according to variations of the fourth embodiment.
Figure 11B:
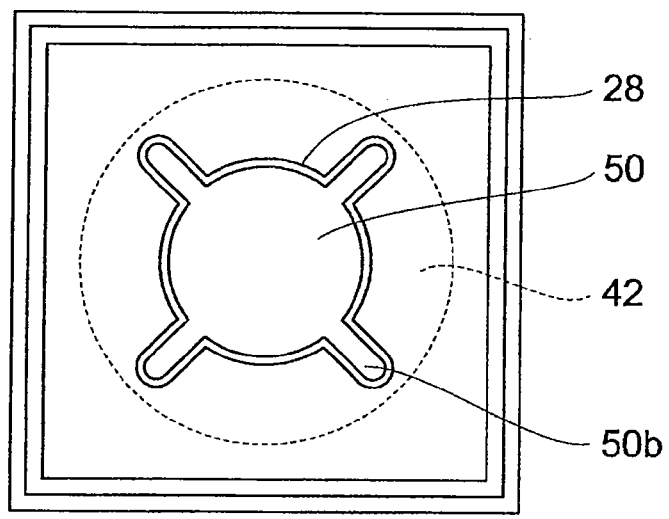
Figure 11C:
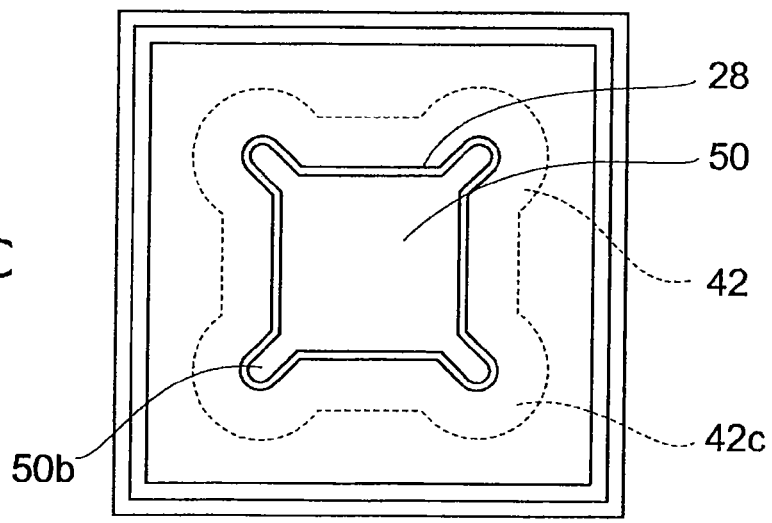

FIGS. 11A to 11C are schematic plan views of light emitting devices according to variations of the fourth embodiment.

In FIG. 11A, the width S2 of the projection 50b is made wider than the width S1 of the projection 50b of FIG. 9A. Then, near the projection 50b, the current can be spread to increase the optical output Po. In FIG. 11B, x1 in the projection 50b is made shorter than x1 in the other region. Then, near the projection 50b, the current can be spread to increase the optical output Po. Furthermore, in FIG. 11C, a projection 50b projected in the diagonal direction of the chip may be provided at the corner of a rectangular first electrode 50.

In the first to fourth embodiment and variations associated therewith, the light emitted downward from the light emitting layer 22 is reflected by the second electrode 40 below the current blocking layer 42, and emitted from the chip surface, where the amount of light blocking by the first electrode 50 is reduced. This facilitates increasing the light extraction efficiency and the optical output. The light emitting device according to the present embodiments facilitates increasing the output (brightness) of illumination devices, display devices, and traffic lights.

The embodiments of the invention have been described above with reference to the drawings. However, the invention is not limited to these embodiments. The material, shape, size, layout and the like of the laminated body, light emitting layer, first conductivity type layer, second conductivity type layer, current blocking layer, first electrode, and second electrode constituting the invention can be variously modified by those skilled in the art. Such modifications are also encompassed within the scope of the invention as long as they do not depart from the spirit of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

The invention claimed is:

1. A light emitting device comprising:
   a light emitting layer;
   a first conductivity type layer provided on the light emitting layer;
   a first electrode provided on the first conductivity type layer;
   a second conductivity type layer provided under the light emitting layer and having thickness t1 (μm);
   a current blocking layer provided in contact with a partial region of a surface of the second conductivity type layer on opposite side from the light emitting layer, and having an outer edge protruding by length x1 (μm) from an outer edge of the first electrode; and
   a second electrode being in contact with a surface of the current blocking layer on opposite side from the second conductivity type layer and a region of the surface of the second conductivity type layer not in contact with the current blocking layer, and being capable of reflecting emission light from the light emitting layer,
   a following formula being satisfied, $$\frac{(x1 - t2 \times \tan 70°)}{\left(\tan 70° + \frac{x1}{t2}\right)} - t1 \geq 0$$

where t2 (μm) is total thickness of the first conductivity type layer, the light emitting layer, and the second conductivity type layer.

2. The device according to claim 1, wherein the current blocking layer includes a dielectric or an insulating semiconductor.

3. The device according to claim 1, wherein a region of an upper surface of the first conductivity type layer where the first electrode is not formed includes an uneven surface.

4. The device according to claim 1, further comprising:
   a dielectric film provided above a region of an upper surface of the first conductivity type layer where the first electrode is not formed, the dielectric film having a refractive index lower than a refractive index of the surface of the first conductivity type layer.

5. The device according to claim 1, wherein the light emitting layer, the first conductivity type layer, and the second conductivity type layer include one of $In_x(Al_yGa_{1-y})_{1-x}P$ ($0 \leq x \leq 1$, $0 \leq y \leq 1$), $Al_xGa_{1-x}As$ ($0 \leq x \leq 1$), and $In_xGa_yAl_{1-x-y}N$ ($0 \leq x \leq 1$, $0 \leq y \leq 1$, $x+y \leq 1$).

6. A light emitting device comprising:
a light emitting layer including $In_x(Al_yGa_{1-y})_{1-x}P$ ($0 \leq x \leq 1$, $0 \leq y \leq 1$);
a first conductivity type layer including $In_x(Al_yGa_{1-y})_{1-x}P$ ($0 \leq x \leq 1$, $0 \leq y \leq 1$) and provided above the light emitting layer;
a first electrode provided on the first conductivity type layer;
a second conductivity type layer including $In_x(Al_yGa_{1-y})_{1-x}P$ ($0 \leq x \leq 1$, $0 \leq y \leq 1$), provided under the light emitting layer, and having thickness t1 (μm);
a current blocking layer provided in contact with a partial region of a surface of the second conductivity type layer on opposite side from the light emitting layer, and having an outer edge protruding by length x1 (μm) from an outer edge of the first electrode; and
a second electrode being in contact with a surface of the current blocking layer on opposite side from the second conductivity type layer and a region of the surface of the second conductivity type layer not in contact with the current blocking layer, and being capable of reflecting emission light from the light emitting layer,
a following formula being satisfied, $$\frac{(x1 - t2 \times \tan 70°)}{\left(\tan 70° + \frac{x1}{t2}\right)} - t1 \geq 0$$

where t2 (μm) is total thickness of the first conductivity type layer, the light emitting layer, and the second conductivity type layer,
the thickness t1 of the second conductivity type layer being equal to or less than thickness of the first conductivity type layer and being in a range of 0.7 μm or more and 1.5 μm or less, and
the length x1 is 30 μm or more and 50 μm or less.

7. The device according to claim 6, wherein the current blocking layer includes a dielectric or an insulating semiconductor.

8. The device according to claim 6, wherein a region of an upper surface of the first conductivity type layer where the first electrode is not formed includes an uneven surface.

9. The device according to claim 6, further comprising:
a dielectric film provided above a region of an upper surface of the first conductivity type layer where the first electrode is not formed, the dielectric film having a refractive index lower than a refractive index of the surface of the first conductivity type layer.

10. The device according to claim 6, wherein the first conductivity type layer includes a cladding layer on the light emitting layer, a current diffusion layer on the cladding layer, and a contact layer on the current diffusion layer.

11. The device according to claim 6, wherein the second conductivity type layer includes a cladding layer under the light emitting layer, a current diffusion layer under the cladding layer, and a contact layer under the current diffusion layer.

12. The device according to claim 6, wherein the first conductivity type layer is of n-type.

13. The device according to claim 12, wherein the second conductivity type layer is of p-type, and the thickness t1 is 0.7 μm or more.

14. The device according to claim 6, wherein the first electrode includes one of a circular shape and a rectangular shape.

15. The device according to claim 14, wherein the first electrode further includes a region projected outward.

16. The device according to claim 14, wherein the current blocking layer is shaped like a similar extension of the first electrode.

17. A light emitting device comprising:
a light emitting layer;
a first conductivity type layer provided on the light emitting layer;
a first electrode provided on the first conductivity type layer, and including a pad portion and a thin interconnection portion connected to the pad portion;
a second conductivity type layer provided under the light emitting layer and having thickness t1 (μm);
a current blocking layer provided in contact with a partial region of a surface of the second conductivity type layer on opposite side from the light emitting layer, and having an outer edge protruding by length x1 (μm) from each of an outer edge of the pad portion and an outer edge of the thin interconnection portion; and
a second electrode being in contact with a surface of the current blocking layer on opposite side from the second conductivity type layer and a region of the surface of the second conductivity type layer not in contact with the current blocking layer, and being capable of reflecting emission light from the light emitting layer,
a following formula being satisfied, $$\frac{(x1 - t2 \times \tan 70°)}{\left(\tan 70° + \frac{x1}{t2}\right)} - t1 \geq 0$$

where t2 (μm) is total thickness of the first conductivity type layer, the light emitting layer, and the second conductivity type layer.

18. The device according to claim 17, wherein the current blocking layer includes a dielectric or an insulating semiconductor.

19. The device according to claim 17, wherein a region of an upper surface of the first conductivity type layer where the first electrode is not formed includes an uneven surface.

20. The device according to claim 17, wherein the light emitting layer, the first conductivity type layer, and the second conductivity type layer include one of $In_x(Al_yGa_{1-y})_{1-x}P$ ($0 \leq x \leq 1$, $0 \leq y \leq 1$), $Al_xGa_{1-x}As$ ($0 \leq x \leq 1$), and $In_xGa_yAl_{1-x-y}N$ ($0 \leq x \leq 1$, $0 \leq y \leq 1$, $x+y \leq 1$).

* * * * *